(12) United States Patent
Huang

(10) Patent No.: US 6,728,910 B1
(45) Date of Patent: Apr. 27, 2004

(54) MEMORY TESTING FOR BUILT-IN SELF-REPAIR SYSTEM

(75) Inventor: Johnnie A. Huang, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 474 days.

(21) Appl. No.: 09/665,749

(22) Filed: Sep. 20, 2000

(51) Int. Cl.[7] .............................................. G11C 29/00
(52) U.S. Cl. ........................ 714/711; 714/718; 365/200; 365/201
(58) Field of Search ................................ 714/711, 718, 714/7, 719, 733; 365/200, 201; 364/200; 703/14

(56) References Cited

U.S. PATENT DOCUMENTS

| | | | | |
|---|---|---|---|---|
| 4,325,120 A | * | 4/1982 | Colley et al. ................ 364/200 |
| 4,701,919 A | * | 10/1987 | Naitoh et al. ................ 371/21 |
| 5,555,212 A | * | 9/1996 | Toshiaki et al. ............ 365/200 |
| 5,579,484 A | * | 11/1996 | Cooper ................ 395/200.08 |
| 5,724,365 A | * | 3/1998 | Hsia et al. ................ 714/718 |
| 5,771,195 A | * | 6/1998 | McClure ................ 365/200 |
| 5,808,948 A | * | 9/1998 | Kim et al. ................ 365/201 |
| 5,920,515 A | * | 7/1999 | Shaik et al. ................ 365/200 |
| 6,065,134 A | * | 5/2000 | Bair et al. ................ 714/7 |
| 6,175,936 B1 | * | 1/2001 | Higgins et al. ............. 714/711 |
| 6,199,031 B1 | * | 3/2001 | Challier et al. ............ 703/14 |
| 6,516,430 B1 | * | 2/2003 | Ogura et al. ................ 714/719 |
| 6,516,450 B1 | * | 2/2003 | Hill et al. ................ 716/4 |

\* cited by examiner

*Primary Examiner*—Albert Decady
*Assistant Examiner*—Dipakkumar Gandhi
(74) *Attorney, Agent, or Firm*—Conley Rose, P.C.

(57) ABSTRACT

A method is presented for self-test and self-repair of a semiconductor memory device. A single built-in self-test (BIST) engine with an extended address range is used to test the entirety of memory (i.e., both redundant and accessible memory portions) as a single array, preferably using a checkerboard bit pattern. An embodiment of the method comprises two stages. In the first stage, faulty rows in each memory portion are identified and their addresses recorded. Known-bad rows in accessible memory are then replaced by known-good redundant rows, and the resulting repaired memory is retested in a second stage. During the second stage, repair of the accessible memory portion is verified, while defects among the redundant portion are ignored. Compared to existing methods, the new method is believed to simplify the interface between the BIST and the built-in self-repair (BISR) circuitry, reduce the overall size of test and repair circuitry, and provide improved test coverage.

19 Claims, 8 Drawing Sheets

| Row 4 | Row 3 | Row 2 | Row 1 | Row 0 | RRow 0 | RRow 1 | RRow 2 | RRow 3 |
|---|---|---|---|---|---|---|---|---|
| 1 | 0 | 1 | 0 | 1 | 1 | 1 | x | x |
| 0 | 1 | 0 | 1 | 0 | 0 | 0 | x | x |
| 1 | 0 | 1 | 0 | 1 | 1 | 1 | x | x |
| 0 | 1 | 0 | 1 | 0 | 0 | 0 | x | x |
| 1 | 0 | 1 | 0 | 1 | 1 | 1 | x | x |
| 0 | 1 | 0 | 1 | 0 | 0 | 0 | x | x |

Fig. 2a

| Row 4 | Row 3 | Row 2 | Row 1 | Row 0 | RRow 0 | RRow 1 | RRow 2 | RRow 3 |
|---|---|---|---|---|---|---|---|---|
| 1 | 0 | 1 | 0 | 1 | x | x | x | x |
| ▨ | 1 | 0 | 1 | 0 | x | x | x | x |
| 1 | 0 | 1 | 0 | 1 | x | x | x | x |
| 0 | 1 | ▨ | 1 | 0 | x | x | x | x |
| 1 | 0 | 1 | 0 | 1 | x | x | x | x |
| 0 | 1 | 0 | 1 | 0 | x | x | x | x |

Figure 8b

Figure 8a

MEMORY TESTING FOR BUILT-IN SELF-REPAIR SYSTEM

BACKGROUND OF THE INVENTION

1. Field of Invention

This invention relates to semiconductor memory and, more particularly, to test and repair of semiconductor memory.

2. Description of Related Art

Semiconductor memory is a crucial resource in modern computers, being used for data storage and program execution. With the exception of the central processor itself, no other component within the computer experiences as high a level of activity. Traditional trends in memory technology are toward greater density (more memory locations, or "cells", per part), higher speed and improved reliability. To some extent, these goals are inconsistent. For example, as memory density increases, the incidence of defects also rises. As a result, production yields of high-density memory devices with zero defects would be so low as to render them prohibitively costly. However, an alternative to building perfect devices is to include spare memory cells along with the primary memory of the device. Additional internal circuitry detects faulty cells, and swaps good cells for known-bad ones. Therefore, as long as there are sufficiently many working cells to replace the defective ones, a fully functional memory device can be made. The primary memory is sometimes referred to as "accessible memory", and the spare memory as "redundant memory". The techniques for internally detecting faulty memory cells and for replacing them with working cells are commonly referred to as "built-in self-test" (hereinafter, "BIST") and "built-in self-repair" (hereinafter, "BISR"), respectively. BIST and BISR are instrumental in obtaining acceptable yields in the manufacture of high-performance semiconductor memory.

Conventional memory devices are typically organized as a matrix of rows and columns, in which each individual cell has a unique row/column address. A popular memory architecture incorporating the above-described BIST and BISR techniques configures spare memory locations as redundant rows. Thus, a nominal m×n memory device is actually configured as m rows and n columns of accessible memory, with p rows (and n columns) of redundant memory. Redundant memory rows are not part of the nominal m×n address space of the device, except when used to replace defective accessible memory rows. Circuitry within the memory device itself performs both the test (BIST) and repair functions. During BIST, this circuitry generates test patterns to identify faulty memory locations. Then, during BISR, it reroutes internal connections, circumventing these locations and effectively replacing defective rows of accessible memory with working redundant rows.

Most currently used BIST/BISR methods test not only the accessible memory, but the redundant rows that are swapped in to replace accessible memory locations that have failed. The memory is certified as repairable only if there are enough functional redundant rows to replace every faulty row in the accessible memory; otherwise, it is considered non-repairable. A memory test generally involves writing a specific bit pattern to a range of memory cells, then reading back the values actually stored and comparing them to the desired pattern. In practice, this task is not easily accomplished. There are a variety of failure mechanisms that the BIST algorithm must be able to recognize. The simplest of these, in which memory cells are "stuck" in a particular logic state, are readily detected. Others, such as interaction between adjacent rows or columns of the memory, are less obvious. A memory cell that is susceptible to adjacent row adjacent column interaction, for example, tends to follow the logic transitions of neighboring cells; this condition would not be apparent, however, if the cell were tested alone. In order to reveal interaction-related failures, memory tests are often conducted using alternating bit patterns in adjacent rows or columns of the memory matrix (commonly referred to as a "checkerboard" pattern).

It is often desirable to incorporate improvements in the BIST to achieve better fault coverage. However, in conventional BIST/BISR methods, the test and repair functions are highly interdependent. Consequently, modification of the BIST algorithm may entail corresponding changes to the BISR mechanism. Therefore, even minor changes to the test algorithm may necessitate difficult or extensive modification of the repair circuitry. In some cases, the modified BIST may be inconsistent with the existing BISR circuitry.

A typical BIST/BISR method employs two BIST stages (also referred to herein as BIST "runs"). In the first stage, the accessible memory is tested row-by-row until a defect is encountered. The row containing the defect is then replaced by the first available redundant row and retested. This process continues until all of the accessible memory has been tested, or until there are no more redundant rows to use as replacements. In the first case, a second BIST run is performed, verifying all of the accessible memory. In the second case, the device is flagged as non-repairable. The two-stage method suffers from several drawbacks, among them the fact that it may overlook adjacent row interaction defects in the memory. Since the method tests accessible memory and redundant memory separately, it cannot detect interaction between adjacent accessible and redundant rows. A further disadvantage of the conventional two-stage method is that the total test time is not predictable. The duration of the test is dependent on the number of bad accessible memory rows, each of which has to be replaced and retested. Since there is no way to know the test time in advance, precise test scheduling during production is impossible.

More complex, multi-stage BIST/BISR methods can be devised to provide better fault detection. However, such methods suffer from the drawback that the array size in each of the BIST runs is different. This demands a separate BIST engine for each run, each specifically configured for its respective array size. The additional circuitry complicates the problem of upgrading BISR circuitry to support BIST enhancements.

The data retention test is another critical evaluation of the memory that may be performed by the BIST. This involves writing a test pattern to the memory, waiting for some prescribed interval, and then reading the memory to determine whether the test pattern was retained. The need for separate BIST tests for each array size in the conventional BIST/BISR method can significantly prolong data retention tests. The test interval is typically on the order of a second, so the retention test may account for the majority of the test time in a BIST run. Consequently, a memory device incorporating a three-stage BIST could require roughly three times as long to test as one with a one-stage BIST.

In view of the above-mentioned problems, it would be desirable to have a method for self-test and self-repair of semiconductor memory devices in which the BISR mechanism is substantially independent of the BIST mechanism, such that changes to the BIST could be accommodated with little or no modification to the BISR. Under the method, the BISR should be consistent with upgrading fault coverage capability in the BIST, e.g., readily supporting improved versions of tests for adjacent row interaction, data retention, etc. In addition, a system embodying the method should be efficient and permit estimation of total test time.

SUMMARY OF THE INVENTION

Conventional two-stage BIST/BISR methods may provide inadequate fault coverage, since they do not test for adjacent row interaction. While more complex BIST/BISR methods can be devised to provide better fault detection, such methods are often complicated by the fact that the array size in each of the BIST runs is different. For example, a memory device can be tested in three stages: the first stage tests the redundant memory along with the adjacent accessible row, the second stage tests the accessible memory along with the adjacent redundant row, and the third stage verifies the repaired accessible memory. However, this method requires a separate BIST engine for each run, specifically configured for its respective array size. This additional circuitry greatly complicates the problem of upgrading BISR circuitry to support BIST enhancements.

The problems outlined above are addressed by a system and method for a self-repairing memory that can be integrated with any BIST mechanism, without extensive modification to either the BIST or BISR mechanisms. Rather than relying on separate BIST mechanisms to test the redundant and accessible memory arrays, a single generic BIST may be used to simultaneously test accessible and redundant portions of the memory. The new method is believed to offer improved fault coverage, since a checkerboard pattern spanning the entire memory is used to test for adjacent row interaction. The new method also has the advantage that test time is consistent and predictable.

The method disclosed herein may be used for self-test and self-repair of a memory comprising first and second arrays. According to this embodiment, the entirety of the memory is tested as a single addressable array, and rows in the first and second arrays that fail the test are detected. After the entire memory has been tested, failing rows from the first array are replaced with non-failing rows from the second array in a repair operation. The entirety of the memory is then retested as a single addressable array. During the retest, failing rows in the second array are ignored. If failing rows are detected in the repaired first array during the retest, a "fail" result is returned; otherwise, a "pass" result is returned. The first array represents the accessible portion of the memory and the second array the redundant portion. According to the method disclosed herein, testing of the memory is done during the first stage of a two-stage procedure, and retesting during the second stage. The repair operation consists of recording the addresses of failing accessible rows in a repair table; associated with each of these addresses is the address of a non-failing redundant row. Using the repair table, the BISR dynamically substitutes a good redundant row for every failing accessible row.

A computer-usable carrier medium having program instructions executable to implement the above-described BIST/BISR method is also contemplated herein. The carrier medium may be a storage medium, such as a magnetic or optical disk, a magnetic tape, or a memory. In addition, the carrier medium may be a wire, cable, or wireless medium along which the program instructions are transmitted, or a signal carrying the program instructions along such a wire, cable or wireless medium. In an embodiment, the carrier medium may contain program instructions in a hardware description language, such as Verilog, to configure circuitry within the memory device capable of implementing the BIST/BISR routine.

In addition to the above-mentioned improved BIST/BISR method and computer-usable medium, a system for self-test and self-repair of a semiconductor memory is contemplated herein. In an embodiment, the system consists of a first m×n memory array, a second p×n memory array, a single built-in self-test (BIST) engine adapted to test the first and second arrays as a single joint array and detect rows failing the test, and built-in self-repair (BISR) circuitry that replaces failing rows in the first array with non-failing rows from the second array. The BIST is configured to generate row addresses that span the entire memory array (i.e., m+p rows). The BISR circuitry is capable of assigning addresses generated by the BIST that exceed the dimensions of the first array (i.e., >m) to rows in the second array. The BISR circuitry may also be capable of reassigning the addresses of failing rows in the first array to rows in the second array. The BIST may test the memory array in two test stages. In the first test stage, the addresses of rows that fail are recorded in a defect list. If there are enough non-failing rows in the second array at the end of the first test stage to replace all the failing rows from the first array, the memory is repaired and retested in a second stage. During the second stage, defects in the first array result in a "fail" test result, while defects in the second array are ignored. If there are no defects in the first array, a "pass" result is returned. Memory tests performed by the BIST may consist of writing a bit pattern to a portion of the memory, then reading back the contents and comparing them to the original bit pattern. A commonly used bit pattern, called a checkerboard, consists of alternating 1's and 0's.

BRIEF DESCRIPTION OF THE DRAWINGS

Other objects and advantages of the invention will become apparent upon reading the following detailed description and upon reference to the accompanying drawings in which:

FIG. 1 illustrates the organization of an exemplary memory device capable of self-repair;

FIG. 2 shows the use of a checkerboard pattern to identify defective cells in a memory device;

FIG. 8 is an illustration of the operations performed on a memory matrix by a BIST/BISR procedure, according to an embodiment of the method disclosed herein.

Figure 3:
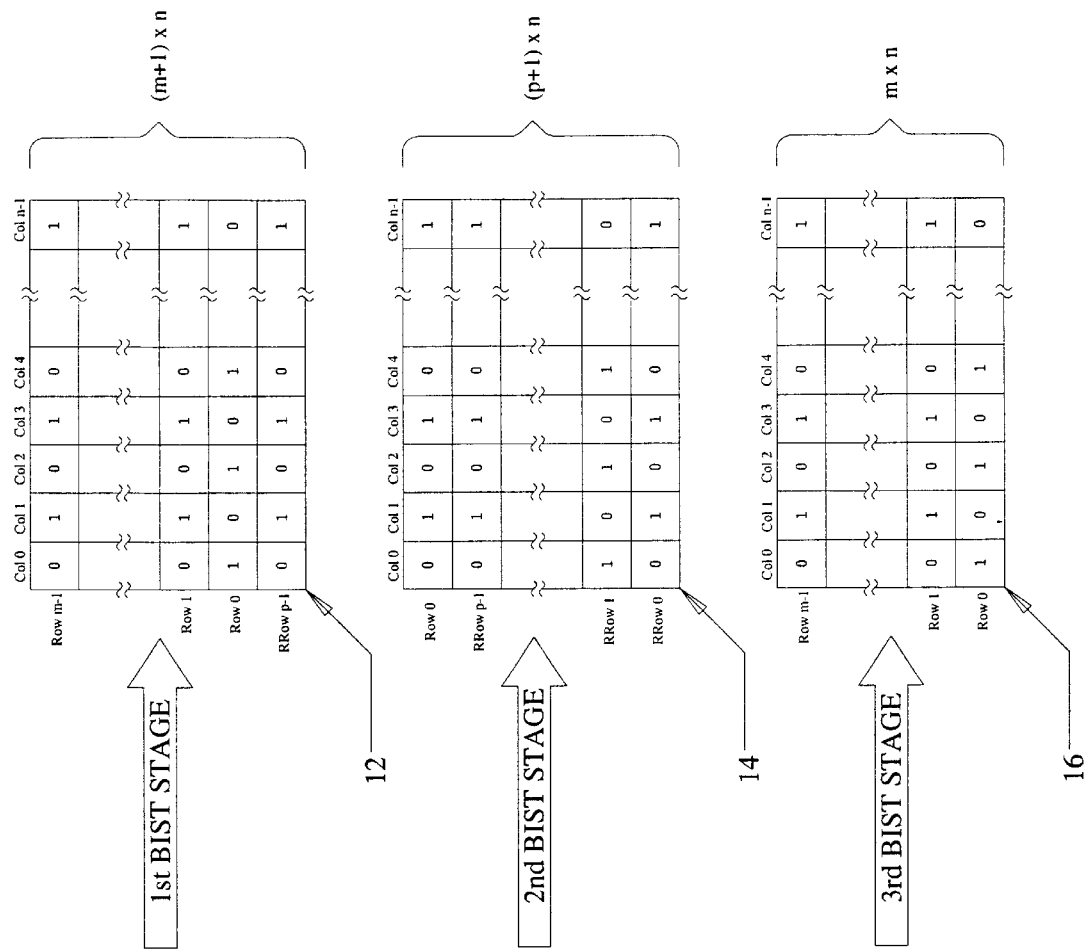
FIG. 3 illustrates a two-stage BIST/BISR procedure and the different array sizes involved.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figures 1A, 1B:
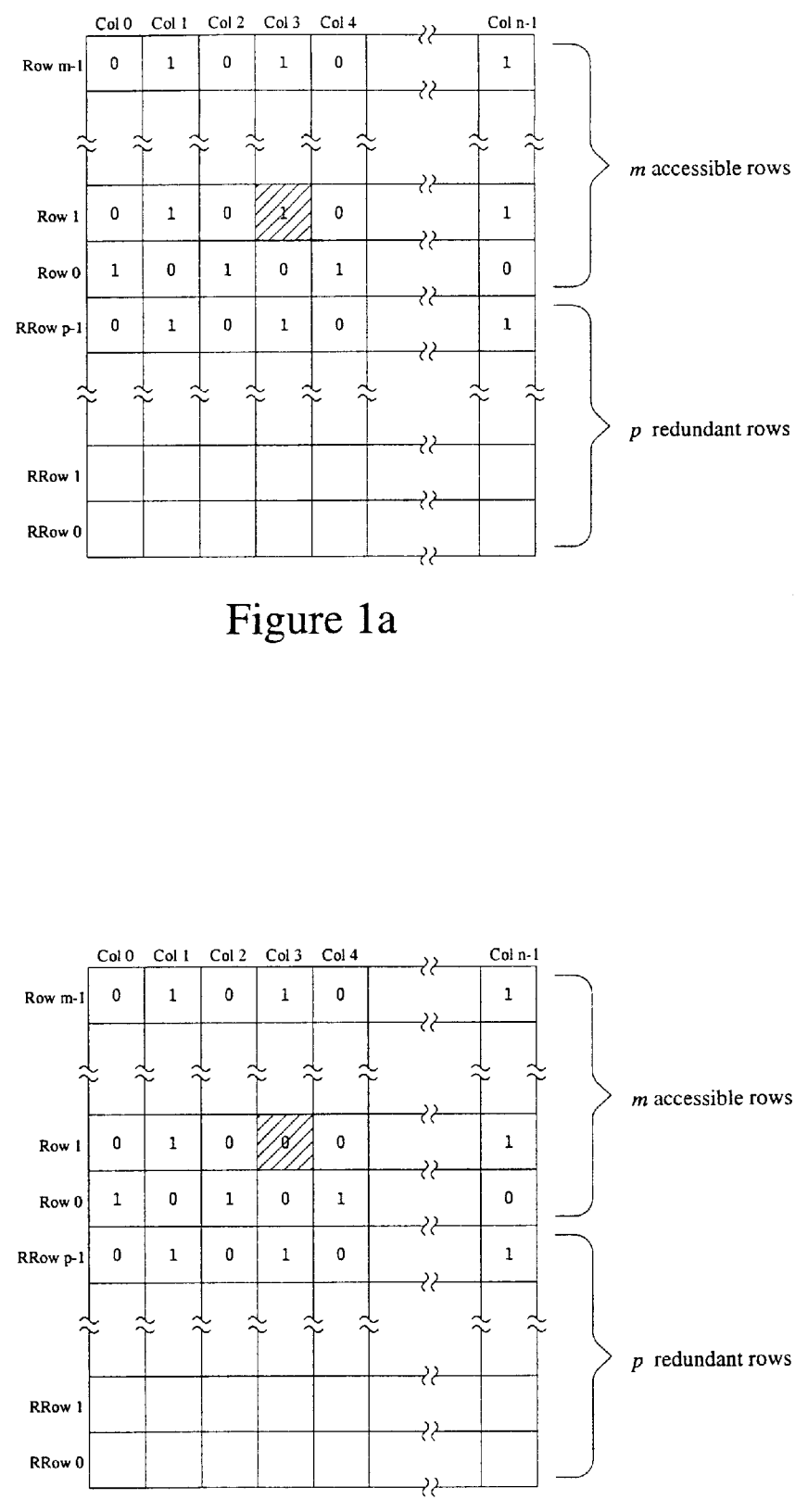

A typical memory device, as considered herein and shown in FIG. 1, may be organized as m×n cells of accessible (i.e., addressable) memory and p×n cells of redundant memory. The use of redundant memory locations, together with on-chip circuitry for testing memory cells and remapping memory addresses, permits built-in selftest (BIST) and built-in self-repair (BISR) of memory devices. The redundant rows, RRow 0–RRow p–1, are depicted in FIG. 1 as being contiguous with the accessible rows, Row 0–Row m–1, with RRow 0 adjacent to Row 0. However, it should be understood that the configuration shown is merely exemplary, and other arrangements are consistent with the method contemplated herein.

A common memory test consists of writing a "checkerboard" pattern to all the memory locations and then reading it back. This test consists of placing alternating 1's and 0's in all the locations, and then verifying that the written values were actually stored in those locations. If a particular cell is defective it will appear as a discrepancy in the checkerboard pattern when it is read back. A cell that cannot be written to will in effect be "stuck" at either a 1 or 0. An attempt to write the opposite value to that cell will fail, and will show up as an anomaly in the checkerboard upon reading back the memory. As an example, assume that the memory location in column 3 of row 1 is defective (indicated by crosshatched pattern) and is stuck at logic level 0. The checkerboard bit pattern shown in FIG. 1a attempts to write a logic level 1 to the faulty cell, but when the memory is read back the resulting pattern is as shown in FIG. 1b. The anomalous occurrence of a 0 in column 3 of row 1 indicates that the written value was not stored, betraying the bad memory cell. Note that two complementary checkerboard patterns are required for a complete test, since this ensures that each cell is tested with both a 1 and a 0.

The checkerboard pattern can also be used to detect interaction between adjacent rows. In such cases, certain cells tend to follow the logic transitions of neighboring cells. As an example, assume the memory cell in column 3 of row 1 is initially at logic state 0, but that it interacts with an adjacent cell (e.g., column 3 of row 2). When the neighboring cell in row 2 is set to logic state 1, the interacting cell changes along with it. As noted in the previous example, the checkerboard pattern writes alternating logic states to adjacent cells. When the memory is read back, the error induced by interaction with the adjacent row is revealed as an anomalous bit pattern in the checkerboard pattern.

Some currently existing BIST/BISR routines consist of a two-stage procedure in which self-test and self-repair functions are performed concurrently. In the first of two BIST runs, the addressable memory is tested row-by-row and defective accessible memory rows are replaced with redundant memory rows on an as-needed basis. A comprehensive test of the addressable memory is then performed in the second BIST run. As described earlier, such methods may be prone to overlook certain types of memory errors, with the possible result that defective devices are certified as good, or good devices flagged as bad.

An example illustrating a disadvantage of such BIST/BISR routines is presented in FIGS. 2a and 2b. Note that the redundant memory rows have indeterminate logic values (shown as X's), since they are not pre-tested by the BIST routine in the embodiment of FIG. 2. A defect (indicated by crosshatched cell) is detected in accessible memory row 2 during the first BIST run, so redundant row 0 is swapped in as a replacement and tested. Now, suppose that accessible row 4 is also found to be defective. This time, redundant row 1 is swapped in and tested. The result of these substitutions is shown in FIG. 2b. Observe that the replacement of faulty accessible rows by redundant rows disrupts the checkerboard bit pattern in the vicinity of accessible row 0, which means that adjacent row interaction is not detectable.

To obtain more rigorous and complete test coverage of the memory device, a three-stage BIST/BISR method may be used to test the entire redundant and accessible portions of the memory device before implementing self-repair. In the first BIST run, a checkerboard pattern is used to test the redundant memory, along with the adjacent row of accessible memory. A similar test is performed on the accessible memory in a second BIST run. Self-repair is then attempted, using known-good redundant rows to replace faulty accessible rows. A third BIST run performs a verification test on the repaired accessible memory. If any errors are detected during the third BIST run, the memory is failed; otherwise, it is certified as good.

A BIST with three or more stages may offer significant advantages over a two-stage method. Evaluating the entire redundant and accessible memory arrays before making any row substitutions facilitates detection of adjacent row interaction defects and enhances fault coverage. Furthermore, since faulty memory rows are identified prior to repair, replacement may be done not on a row-by-row basis, but in a single repair step. Thus, the overall repair time is fixed and predictable. However, there are drawbacks associated with implementation of the multi-stage BIST.

BIST routines are typically embodied as a state machine, often referred to as a BIST engine. The state machine may be created using some form of silicon compiler and implemented using circuitry internal to the memory device. However, the majority of the available silicon in the memory device is allocated to the memory array itself, limiting the complexity of the BIST. Consequently, a BIST engine is generally designed to operate with a fixed array size. Thus, a separate BIST is needed for each array size that is encountered in the complete BIST/BISR sequence.

For example, the three-stage BIST/BISR method discussed above requires three different array sizes to be handled by the BIST and BISR circuitry. As shown in: FIG. 3, the complete memory array 10 is comprised of redundant rows RRow 0–RRow p–1, and accessible rows Row 0–Row m–1. The first BIST run 12 tests the (m+1)×n array consisting of the m accessible rows, together with the adjacent redundant row RRow p–1. Similarly, the second run 14 tests the (p+1)×n array consisting of the p redundant rows, together with the adjacent accessible row Row 0. The third BIST run 16 tests the m×n array consisting of the m rows of the (repaired) accessible memory. As discussed in detail below, not only does each array size require a dedicated BIST, but the associated BISR circuitry must often be modified whenever the respective BIST changes. BIST methods employing more than two stages would therefore require additional dedicated BIST circuitry.

Figure 4:
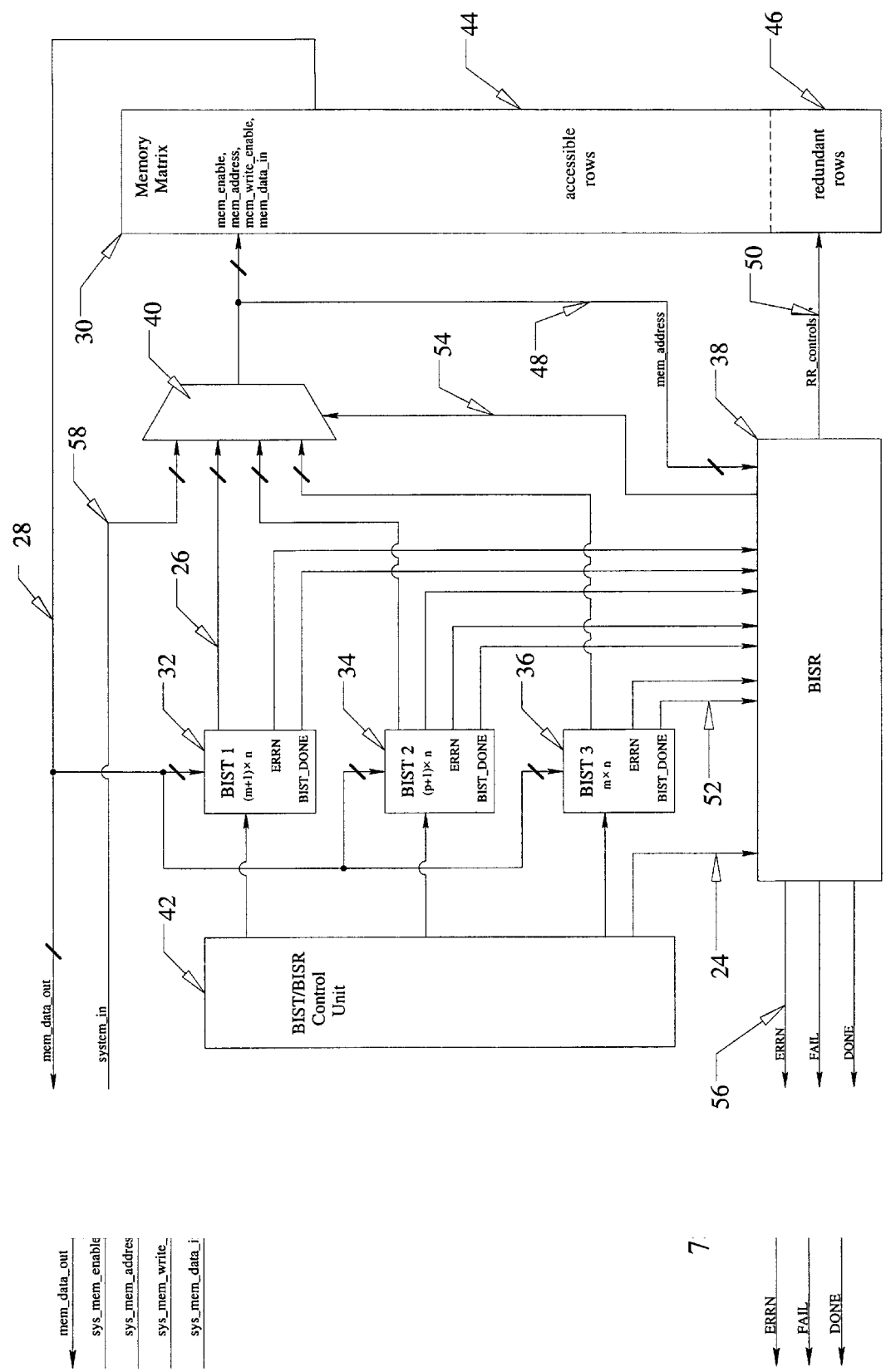
FIG. 4 is a block diagram of a conventional interface between BIST/BISR circuitry and the memory matrix.

FIG. 4 is a block diagram illustrating a typical interface between a BIST/BISR system and memory matrix. The figure represents circuitry within the memory device, with externally accessible signals shown entering and exiting the device at the far left. In this figure, the memory matrix 30 is comprised of both accessible 44 and redundant 46 rows. BIST engines 32, 34, and 36, shown in FIG. 4 are each configured to access a different-sized portion of the entire memory matrix 30. FIG. 4 is consistent with a three-stage BIST/BISR routine applied to the memory device such as shown in FIG. 1. In this case, BIST 1 32 may make a first-stage test of the accessible memory 44 together with an adjacent redundant row 46 (m+1 rows), while BIST 2 34 performs a second-stage test of the redundant memory 46 together with an adjacent accessible row 44 (p+1 rows). BIST 3 36 verifies the repaired accessible memory 44 (m rows). Various memory control signals, such as memory address, write enable, etc., are shared between the BISTs 32, 34, and 36 and the outside world via multiplexer 40. During normal operation, these control signals are furnished by external circuitry via system_in bus 58; during self-test, the signals are generated by the BISTs via internal bus 26. BISR 38 switches multiplexer 40 by means of control line 54, and also mediates access to the redundant memory via RR_controls bus 50. The data output 28 from the memory is fed back to the BISTs 32, 34, and 36 to allow input/output comparison of test patterns. Each BIST generates an error flag when a defect is detected (ERRN) and a flag indicating that the test stage is complete (BIST_DONE). ERRN and BIST_DONE flags from the three BISTs 52, representing status and results of individual stages are routed to the BISR 38. Since BISTs 32, 34 and 36 each test different portions of the memory, their error flags are combined by the BISR 38. The BISR also uses the error flags, together with the current memory address 48, to perform self-repair of the accessible memory. Overall status and results are presented by the BISR 38 as externally accessible signals ERRN, FAIL and DONE flags 56. Operation of the three BISTs 32, 34, and 36, and the BISR 38 is coordinated by the BIST/BISR Control Unit 42 via control lines 24.

The data input (system_in bus 58) and output (mem_data_out bus 28) normally constitute an "I/O path" for the accessible memory array. That is, data are written to a row of accessible memory via system_in 58 and read from the accessible row via mem_data_out 28. However, the BISR is able to reroute the I/O path to a redundant row, using RR_controls bus 50. When a defect in the accessible memory is discovered during self-test, the BISR places the defective row address in a lookup table (referred to herein as a "repair table"). Associated with each defective row address in the repair table is a redundant row. To repair the memory, the BISR reassigns the address of each defective row to one of the available redundant rows using the repair table. In effect, the BISR substitutes a good row for a bad one. When the repaired memory device is in use, the BISR performs this substitution dynamically. Each time the memory is accessed, the BISR compares the current address with the defective row addresses in its repair table; in the event of a match, the BISR automatically substitutes the corresponding redundant row into the I/O path. Clearly, there is some overhead associated with these additional operations. However, the BISR circuitry is typically fast enough not to significantly degrade the operating speed of the memory device. At the end of the third BIST stage, when the test is concluded, BISR 38 sets the DONE and (depending on the test outcome) FAIL indicators 56.

A checkerboard pattern may be used to test for adjacent row interaction in the first BIST run. This pattern must comprise all the accessible rows, together with the redundant row adjacent to the accessible memory. The BISTs 32, 34, 36 typically cannot directly access the redundant rows 46. Therefore, BISR 38 must address the adjacent redundant row (using redundant row control signals 50), while the BIST generates the bit pattern for the row. Along with the memory address, the BISR monitors the error indicator ERRN for each of the BISTs. Depending on which BIST is active, the BISR may or may not substitute redundant rows for the memory address at the time of the error. Such coordinated interaction between the BIST and BISR requires logic circuitry common to both. Therefore, if the BIST is modified, corresponding changes must often be made to the BISR. This is a drawback, since the test algorithms that are the basis for the BIST state machines are frequently subject to change. Therefore, while it is desirable to incorporate improved test procedures in the BIST, the associated (possibly extensive) changes to the BISR present an obstacle.

Figure 5:
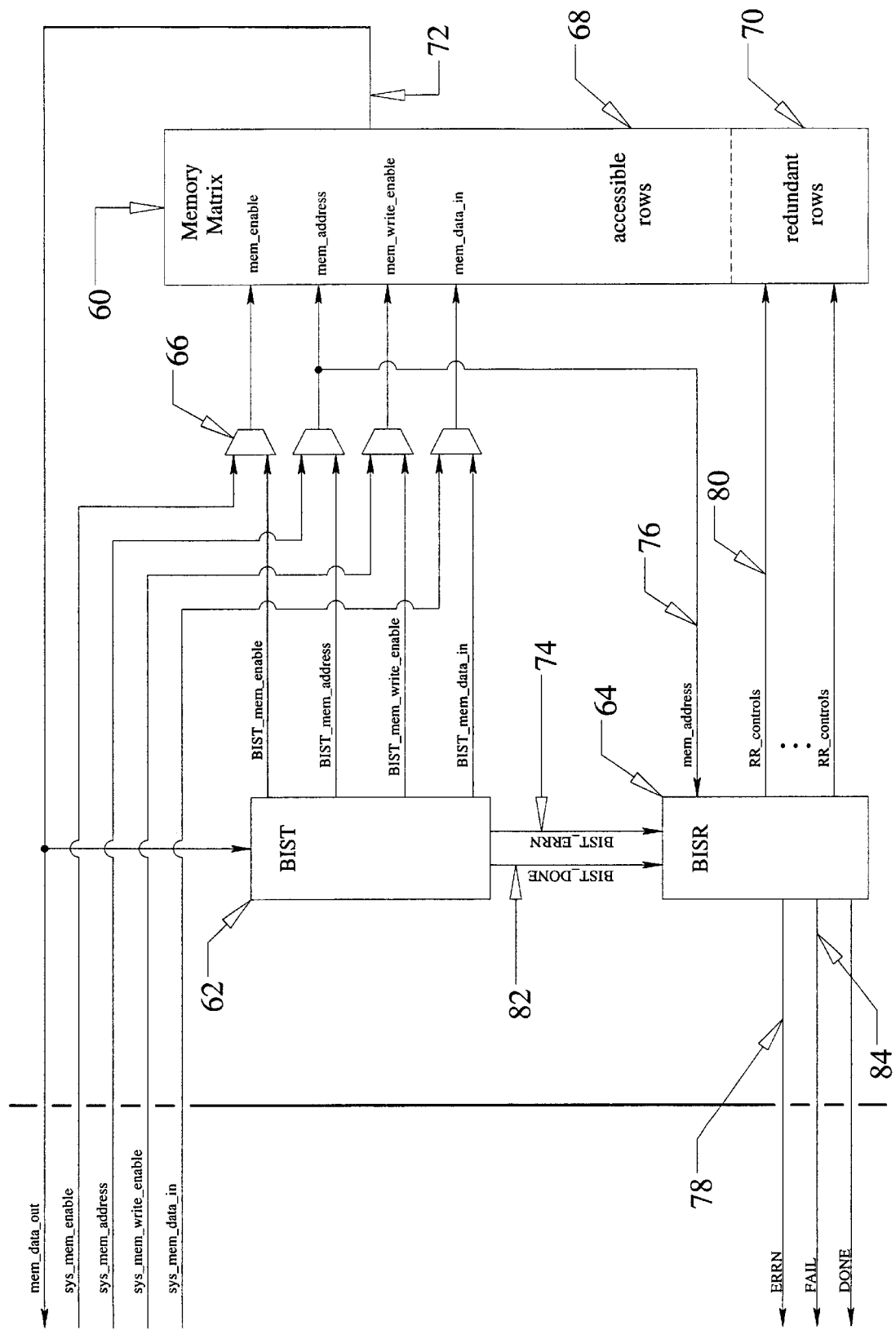
FIG. 5 is a block diagram of an interface between BIST/BISR circuitry and the memory matrix, according to an embodiment of the method disclosed herein.

The method disclosed herein overcomes the need for multiple BISTs by treating the entire memory, comprising both accessible and redundant portions, as a single array. By this means, a single fixed-size BIST is used for the entire BIST/BISR procedure. The single BIST is designed to address an array that is larger than the accessible memory. For example, if the memory device is organized as an m×n accessible memory array, together with a p×n redundant memory array, the BIST will be configured to address a single (m+p)×n array. Row addresses beyond the accessible memory (>m) are herein referred to as "out-of-range" addresses. Self-test and self-repair may be accomplished in a two-stage procedure, in which the same array size is used in both stages. FIG. 5 is a functional block diagram of a system implementing the method. As with FIG. 4, externally accessible signals are shown at the far left. The memory matrix 60 contains both accessible rows 68 and redundant rows 70, and the test/repair circuitry comprises a single BIST 62 and BISR 64. The BIST 62 is adapted to address and write data to the accessible memory 68 by means of multiplexers 66, and read data back from accessible memory data output 72. The BISR 64 is configured to receive BIST_ERRN 74 and BIST_DONE flags 82 from the BIST 62, indicating error and test complete conditions, respectively. The BIST may then set the BIST_ERRN error flag each time it detects a faulty memory cell. BISR 64 uses this flag, along with the current memory address 76, to determine when to access the redundant memory 70, as described below. As with the two-stage example in FIG. 4, the BISR is able to switch redundant memory rows into the I/O path, using redundant memory control signals 80. Externally accessible BIST result flags ERRN, FAIL and DONE 78 may be generated by the BISR 64.

In the first stage of an embodiment of the method, BIST 62 generates row addresses from 0 to m+p−1. The first m addresses correspond to accessible memory, and are directly accessed by the BIST, using the multiplexers 66. When an address greater than m appears on mem_address bus 76, the BISR recognizes this as an out-of-range address, and switches the corresponding redundant row into the I/O path. From the perspective of the BIST, the redundant rows appear to be additional rows of accessible memory, and are tested in the same manner. As the BIST tests all the accessible and redundant memory rows, it toggles BIST_ERRN 74 each time a defect is found. The BISR responds to the BIST_ERRN flag by recording the defective row address in a repair table. At the end of the first BIST stage, the lookup table contains the addresses of all of the faulty rows of accessible and redundant memory. A repair table is then created, in which each defective accessible row is paired with a good redundant row.

In a second stage, the BIST may retest the memory, again generating row addresses from 0 to m+p−1. As it does so, the BISR monitors the addresses on mem_address bus 76. If an address is within the accessible memory (i.e., <m), the BISR compares it to the defective row addresses in its repair table. For each defective accessible row, the BISR substitutes the associated good redundant row. Thus, when the BIST retests the first m rows of the memory, it is actually testing a combination of accessible and redundant rows that tested good in the first stage. If an error occurs in the first m rows during the second stage, the memory is considered non-repairable, and the BISR toggles the externally-accessible FAIL flag 84. Addresses beyond the accessible memory (i.e., =m−1) are effectively omitted from testing. During the second stage, when the BISR detects an out-of-range address on mem_address bus 76, it suppresses the error flags ERRN 78 and FAIL 84. This is justifiable, since these addresses are not within the nominal address range of the memory device.

Figure 6:
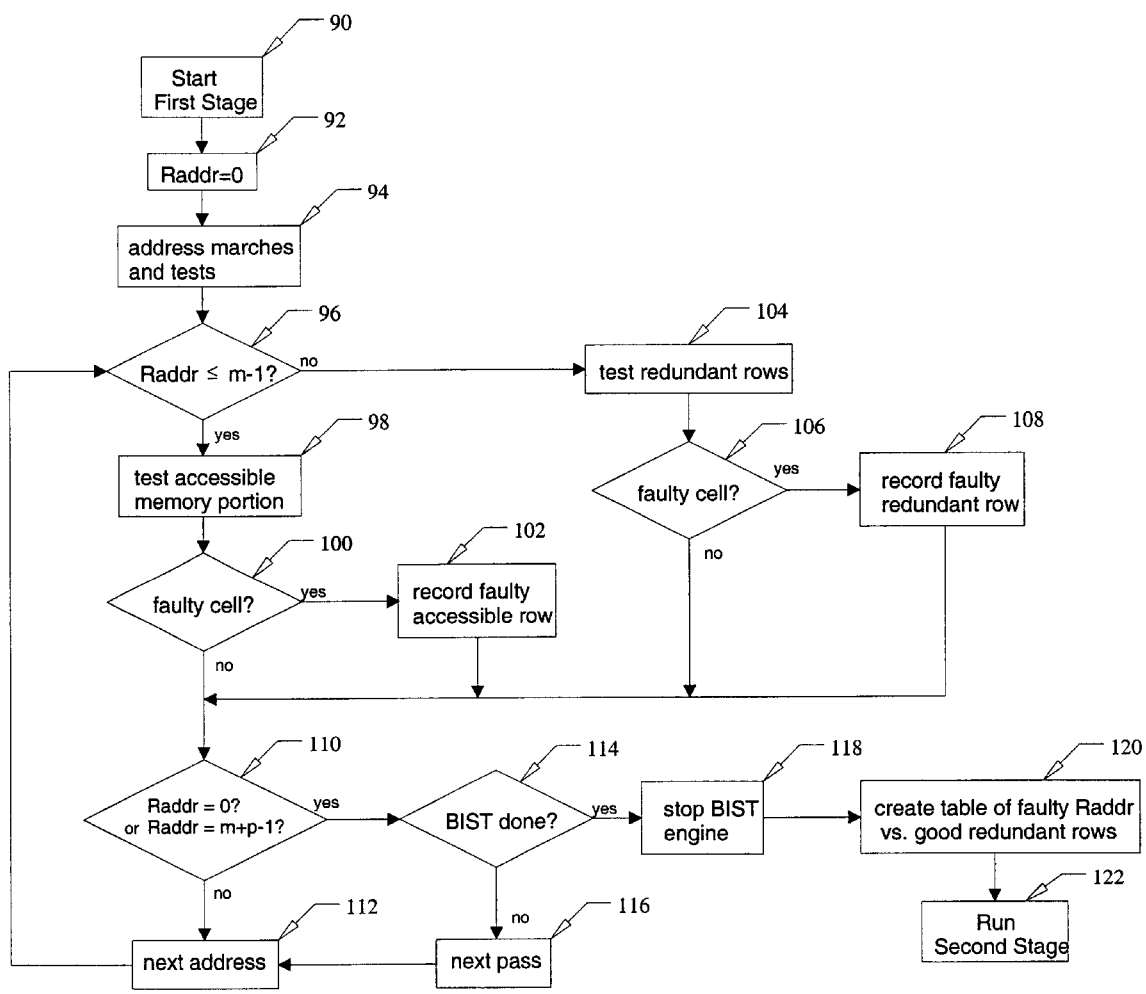
FIG. 6 is a flowchart illustrating the sequence of operations for the first stage of a two-stage BIST/BISR procedure, according to an embodiment of the method disclosed herein.
Figure 7:
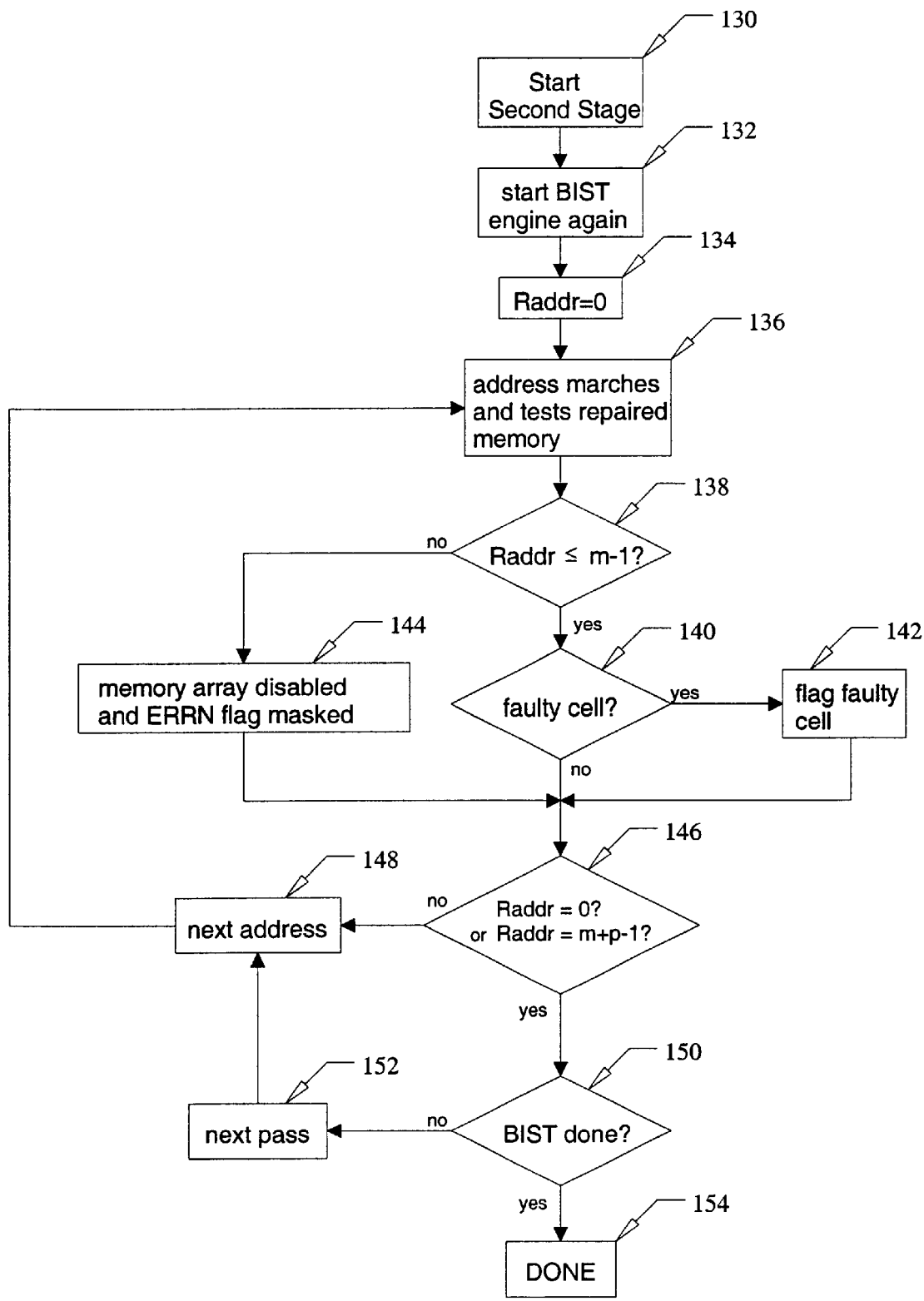
FIG. 7 is a flowchart illustrating the sequence of operations for the second stage of a two-stage BIST/BISR procedure, according to an embodiment of the method disclosed herein.

A two-stage BIST/BISR procedure exemplifying the method disclosed herein is illustrated by the flowcharts in FIGS. 6 and 7. FIG. 6 represents the first stage, and FIG. 7 the second. In FIG. 6, as the first stage begins 90, the row address $R_{addr}$ is initialized 92 with a starting value of 0. One of (possibly several) address marches and test patterns 94 is then selected to be performed on the memory. The specific nature of these tests depends on the BIST design. However, according to the method disclosed herein, the BISR requires only the ERRN and BIST_DONE flags generated by the BIST, and is insensitive to the BIST's internal configuration. The current address is compared 96 with m−1 to determine whether the next row to be tested is in the accessible or the redundant memory portion. If $R_{addr}$ is within the accessible memory portion, it is tested 98. If a faulty cell is found 100 in that row, the row address is recorded 102. The row address is then compared 110 against the upper and lower limits of the memory (i.e., $R_{addr}$=0, or $R_{addr}$=m+p−1). If the upper or lower limit of memory has not been reached, $R_{addr}$ is set to the next address 112, and current address is again compared 96 with m−1, to determine whether it is that of an accessible or a redundant row. If the address is that of a redundant row, the redundant row is switched into the I/O path and tested 104. If the row is found to be defective 106, its address is recorded 108 in the defect list. Testing continues until the address comparison 110 indicates that the last row has been tested. In that case, the BIST_DONE flag indicates 114 whether another pass is to be made through the memory array 116, or testing is completed 118. In the latter case, a repair table is built 120, in which each defective accessible row is paired with a good redundant row, and the second stage commences 122.

At the beginning of the second stage 130, shown in FIG. 7, the BIST engine is restarted 132 and the row address is initialized 134 to 0. The test sequences used in the first stage are then repeated 136 for the entire (m+p)×n memory array. $R_{addr}$ is compared 138 to m−1, to determine whether it is the address of an accessible or a redundant row. If the current row is within the accessible memory, it is tested 140; if it is within the redundant memory, however, error reporting is disabled 144. Verification of the out-of-range addresses is unnecessary, since they are not accessible when the memory device is in use. Using the repair table, faulty accessible rows that were identified in the first stage are replaced in the second stage by redundant rows, which are automatically switched by the BISR into the I/O path. If a defect is found in the second stage, it is flagged 142, and the remaining memory locations are tested. After each row is tested, $R_{addr}$ is checked 146 to see if the upper or lower limit of memory has been reached. If not, the next row is tested 148. If so, the BIST_DONE flag is tested 150 to determine if the last pass has been made. If the flag is not set, the next pass through the entire memory array is started 152. The second stage of the test ends 154 when the BIST_DONE flag is set. If the FAIL flag is set, the memory is declared non-repairable; otherwise, the memory is considered successfully repaired and tested.

Figures 8A, 8B:
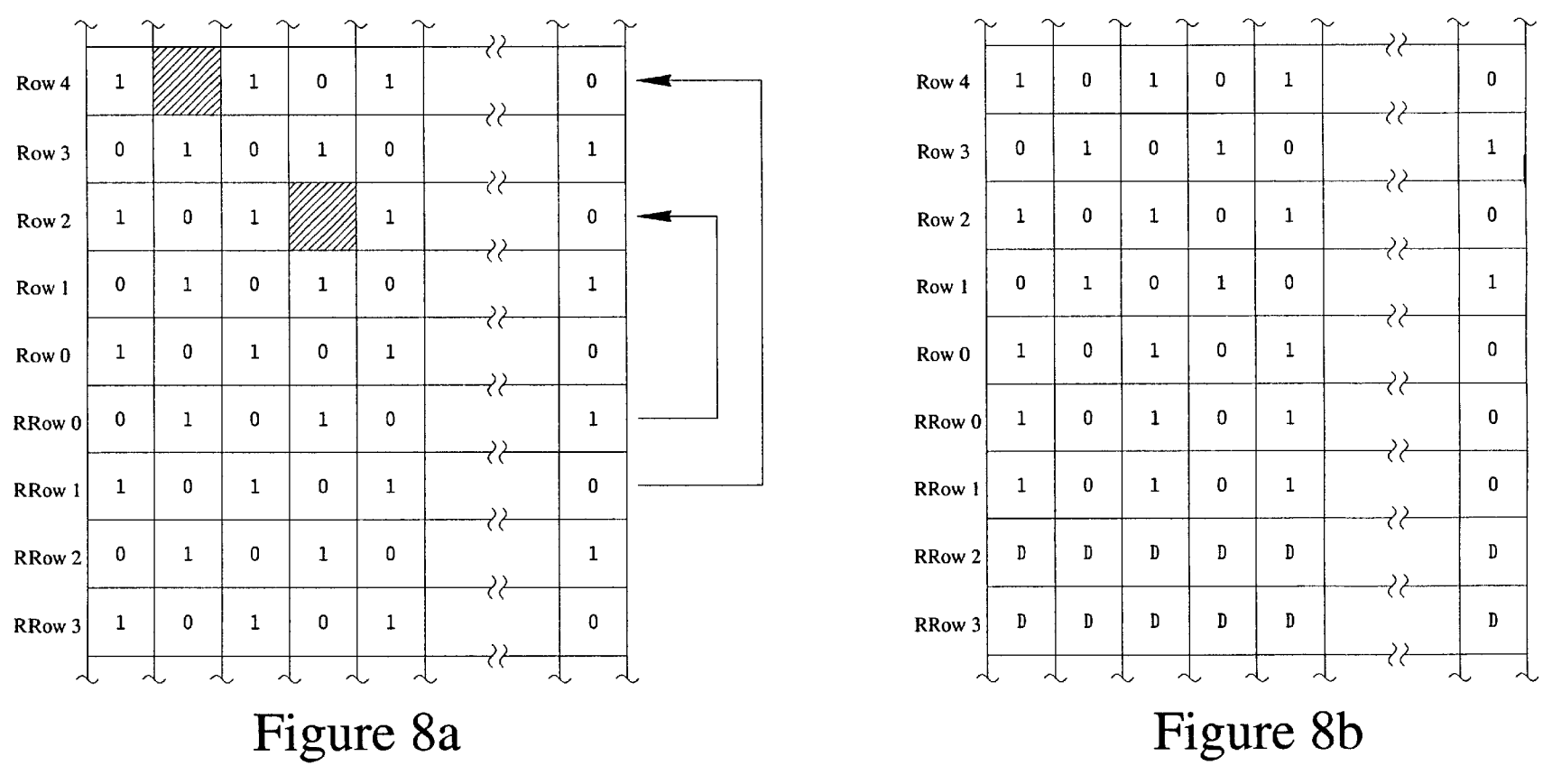

FIG. 8 illustrates the use of the method disclosed herein for self-test and self-repair of a memory device. The memory matrix is the same one shown in FIG. 2, having m accessible rows and p redundant rows. FIG. 8a represents the state of affairs during the first of two BIST runs. Row 2 and Row 4 of the accessible memory contain defects, indicated with hash-lines. Since the BIST is configured to address an (m+p)×n array, it tests the entire memory matrix with a checkerboard pattern. This is effective in detecting interaction between any adjacent rows. The row addressing sequence of this embodiment is shown by the large arrows: The accessible rows 0 through m−1 are addressed first, followed by the redundant rows m through m+p−1. Two of the redundant rows, RRow 0 and RRow 1, are allocated to replace the two defective accessible rows Row 2 and Row 4, as indicated by the solid arrows. This is accomplished by pairing Row 2 with RRow 0 and Row 4 with RRow 1 in the repair table created at the end of the first stage.

During the second of the two BIST runs, the memory matrix may be represented as in FIG. 8b. The BIST generates an m+p row addressing sequence, beginning with the m accessible rows. This time, however, RRow 0 is substituted for defective Row 2, and RRow 1 for Row 4, so no defects are detected among the first m addresses. And, since the BISR overrides the BIST when it tests rows with out-of-range addresses, no defects will ever be reported for this portion of the memory matrix. This is indicated by the D's in RRow 2 and RRow 3. Note that, in comparison with the method of FIG. 2, the method disclosed herein performs a more comprehensive test of the memory array. Many of the redundant rows in FIG. 2b (the ones indicated by X's) are never tested with a checkerboard pattern to detect interaction between rows or columns. However, according to the method disclosed herein, all of the redundant rows in FIG. 8b have previously been tested with a checkerboard pattern in the first BIST run.

A number of advantages are believed to result from the method and system described herein. Since a single BIST is used, as opposed to multiple BISTs configured for different array sizes, the size and complexity of the on-chip BIST/BISR circuitry is reduced. Moreover, because a single generic BIST is used, there is less interaction between the BIST and the BISR; therefore, the BISR is less affected by changes in the BIST algorithm. Consequently, designers may more easily incorporate improved BISTs in their memory devices. Furthermore, since the BIST addresses the entire memory array, adjacent row interaction tests can be performed using a checkerboard pattern that spans both the accessible and redundant portions of the memory, greatly improving fault coverage. Resources required for implementation of the improved BIST/BISR routine disclosed herein are not significantly different or more extensive than would be needed for implementation of existing routines, so its incorporation into memory devices is believed to be straightforward.

It will be appreciated by those skilled in the art having the benefit of this disclosure that this invention is believed to present a system and method for built-in self-test and self-repair of a semiconductor memory. Further modifications and alternative embodiments of various aspects of the invention will be apparent to those skilled in the art in view of this description. Such details as the number and order of BIST runs described herein are exemplary of a particular embodiment. It is intended that the following claims be interpreted to embrace all such modifications and changes and, accordingly, the specification and drawings are to be regarded in an illustrative rather than a restrictive sense.

What is claimed is:

1. A system for self-test and self-repair of a semiconductor memory, said system comprising:
   a first portion of the memory, comprising an array of m rows and n columns;
   a second portion of the memory, comprising a array of p rows and n columns;
   test circuitry adapted to access the first and second portions as a single joint array comprising m+p rows and n columns, test the entirety of the joint array and detect rows failing the test, wherein the test circuitry comprises a single built-in self-test (BIST) engine having a fixed array size;
   repair circuitry adapted to replace failed rows in the first portion with non-failing rows from the second portion; and
   wherein the test circuitry is further adapted to retest the first and second portions of memory, while ignoring failing rows in the second portion.

2. The system as recited in claim 1, wherein the repair circuitry is adapted to replace a first row with a second row by assigning the address of the first row to the second row.

3. The system as recited in claim 1, wherein the repair circuitry is further adapted to assign rows in the second portion of the memory to row addresses that exceed the size of the first portion of memory.

4. The system as recited in claim 1, wherein the repair circuitry is further adapted to return a "fail" result if the test circuitry detects a failed row in the first portion of memory during the retest, or to return a "pass" result otherwise.

5. The system as recited in claim 1, wherein the test circuitry is adapted to test the joint array by writing a bit pattern to the array, reading back the contents of the array, and comparing the contents to the original bit pattern.

6. The system as recited in claim 5, wherein the bit pattern is a sequence of 1's and 0's, alternating row-wise and column-wise.

7. A method for self-test and self-repair of a memory comprising first and second arrays, said method comprising:
   testing the entirety of the memory as a single addressable array, thereby detecting which rows of the first and second arrays fail the test;
   replacing failed rows within the first array with non-failed rows from the second array; and
   re-testing the entirety of the memory as a single addressable array, ignoring failed rows within the second array.

8. The method as recited in claim 7, wherein a "fail" result is returned if any rows within the first array fail during the re-test, and a "pass" result is returned otherwise.

9. The method as recited in claim 7, wherein the first array comprises accessible memory and the second array comprises redundant memory.

10. The method as recited in claim 7, wherein testing of the memory is done during a first run, and re-testing of the memory is done during a second run.

11. The method as recited in claim 7, wherein replacing failed rows within the first array with non-failed rows from the second array comprises assigning the address of the first row to the second row.

12. The method as recited in claim 7, wherein rows in the second portion of the memory array are assigned to row addresses that exceed the size of the first portion of memory array.

13. A computer-usable carrier medium, comprising:
    first program instructions defining operations performable by a test execution unit for testing the entirety of a memory comprising first and second portions, and for recording which rows fail the test; and
    second program instructions defining operations performable by the test execution unit for retesting the entirety of the memory, and detecting any rows within the first portion that fail the test, while ignoring rows in the second portion that fail.

14. The computer-usable carrier medium as recited in claim 13, further comprising third program instructions defining operations performable by a repair execution unit for replacing failing rows in the first memory portion with non-failing rows from the second portion, wherein replacing a first row by a second row comprises assigning the address of the first row to the second row.

15. The computer-usable carrier medium as recited in claim 13, wherein the second program instructions further define operations performable by the test execution unit for returning a "fail" result if a failed a row is detected in the first portion of memory during the retest, and returning a "pass" result otherwise.

16. The computer-usable carrier medium as recited in claim 13, wherein said execution unit comprises a sequential computational engine.

17. The computer-usable carrier medium as recited in claim 16, wherein said sequential computational engine comprises a state-machine.

18. The computer-usable carrier medium as recited in claim 13, wherein said program instructions comprise a hardware description language.

19. The computer-usable carrier medium as recited in claim 13, wherein said program instructions are executable on a computer running a software simulator, such that all possible operations of the execution unit can be simulated.

* * * * *